(12) United States Patent
Kubota et al.

(10) Patent No.: US 9,022,531 B2
(45) Date of Patent: May 5, 2015

(54) PIEZOELECTRIC ELEMENT, LIQUID DISCHARGE HEAD AND LIQUID DISCHARGE APPARATUS

(71) Applicants: Canon Kabushiki Kaisha, Tokyo (JP); Tokyo Institute of Technology, Tokyo (JP); Sophia School Corporation, Tokyo (JP)

(72) Inventors: Makoto Kubota, Yokohama (JP); Kaoru Miura, Matsudo (JP); Hisato Yabuta, Machida (JP); Takayuki Watanabe, Yokohama (JP); Jumpei Hayashi, Chofu (JP); Hiroshi Funakubo, Yokohama (JP); Shintaro Yasui, Yokohama (JP); Takahiro Oikawa, Yokohama (JP); Jun-ichi Nagata, Yokohama (JP); Hiroshi Uchida, Tokyo (JP)

(73) Assignees: Canon Kabushiki Kaisha, Tokyo (JP); Tokyo Institute of Technology, Tokyo (JP); Sophia School Corporation, Tokyo (JP)

( * ) Notice: Subject to any disclaimer, the term of this patent is extended or adjusted under 35 U.S.C. 154(b) by 165 days.

(21) Appl. No.: 13/770,250

(22) Filed: Feb. 19, 2013

(65) Prior Publication Data

US 2013/0222482 A1    Aug. 29, 2013

(30) Foreign Application Priority Data

Feb. 28, 2012    (JP) ................... 2012-041571

(51) Int. Cl.
*B41J 2/045*    (2006.01)
*H01L 41/18*    (2006.01)
(Continued)

(52) U.S. Cl.
CPC .............. *H01L 41/18* (2013.01); *B41J 2/045* (2013.01); *B41J 2/14233* (2013.01);
(Continued)

(58) Field of Classification Search
CPC .... B41J 2/045; B41J 2/14233; B41J 2202/03; H01L 41/0478; H01L 41/0815; H01L 41/1878; H01L 41/316; H01L 41/318
USPC ............ 347/68, 54, 44, 45, 72; 310/358, 311, 310/365, 357; 501/135, 134, 136
See application file for complete search history.

(56) References Cited

U.S. PATENT DOCUMENTS 7,591,543 B2 *    9/2009    Aoki et al. ...................... 347/68
8,034,250 B2    10/2011    Hayashi et al.
(Continued)

FOREIGN PATENT DOCUMENTS

JP    2007-287739 A    11/2007
WO    2011/111643 A1    9/2011

OTHER PUBLICATIONS

Saburo Nagakura et al. (ed.), Iwanami Dictionary of Physics and Chemistry, 5th Edition, p. 1268-1269 (Iwanami Shoten, Publishers; Feb. 20, 1998).

(Continued)

*Primary Examiner* — Manish S Shah
(74) *Attorney, Agent, or Firm* — Fitzpatrick, Cella, Harper & Scinto

(57) ABSTRACT

The piezoelectric element includes, on a substrate: a piezoelectric film; and a pair of electrodes provided in contact with the piezoelectric film; in which the piezoelectric film contains a perovskite-type metal oxide represented by the general formula (1) as a main component:

$$A_x(Zn_jTi_{(1-j)})_l(Mg_kTi_{(1-k)})_m M_n O_3 \quad \text{General Formula (1)}$$

wherein the perovskite-type metal oxide is uniaxially (111)-oriented in pseudo-cubic notation in a thickness direction, of the pair of electrodes, a lower electrode provided on the substrate side is a multilayer electrode including at least a first electrode layer in contact with the substrate and a second electrode layer in contact with the piezoelectric film, and the second electrode layer is a perovskite-type metal oxide electrode which is uniaxially (111)-oriented in pseudo-cubic notation in a thickness direction.

17 Claims, 5 Drawing Sheets

(51) Int. Cl.
*B41J 2/14* (2006.01)
*H01L 41/047* (2006.01)
*H01L 41/08* (2006.01)
*H01L 41/187* (2006.01)
*H01L 41/316* (2013.01)
*H01L 41/318* (2013.01)

(52) U.S. Cl.
CPC ....... *H01L 41/0478* (2013.01); *H01L 41/0815* (2013.01); *H01L 41/1878* (2013.01); *H01L 41/316* (2013.01); *H01L 41/318* (2013.01); *B41J 2202/03* (2013.01)

(56) References Cited

U.S. PATENT DOCUMENTS

| | | | |
|---|---|---|---|
| 2005/0218466 A1* | 10/2005 | Kondo et al. | 257/415 |
| 2005/0219793 A1* | 10/2005 | Matsuda et al. | 361/321.2 |
| 2007/0097182 A1* | 5/2007 | Kubota et al. | 347/70 |
| 2010/0025617 A1 | 2/2010 | Kubota et al. | |
| 2011/0268965 A1 | 11/2011 | Kubota et al. | |
| 2013/0127298 A1 | 5/2013 | Kubota et al. | |

OTHER PUBLICATIONS

Matthew R. Suchomel et al., "Bi2ZnTiO6: A Lead-Free Closed-Shell Polar Perovskite with a Calculated Ionic Polarization of 150 μC cm-2," 18 Chem. Mater. 4987-4989 (Sep. 2006).

Joel Zylberberg et al., "Bismuth Aluminate: A New High-Tc Lead-Free Piezo-Ferroelectric," 19 Chem. Mater. 6385-6390 (Nov. 2007).

Satoshi Wada et al., "Enhanced Piezoelectric Property of Barium Titanate Single Crystals with Engineered Domain Configurations," 38 Jpn. J. Appl. Phys. 5505-5511 (1999).

Hiroshi Funakubo et al., "Metal Organic Chemical Vapor Deposition Growth of Epitaxial SrRuO3 and CaRuO3 Thin Films with Different Orientations as the Bottom Electrode for Epitaxial Ferroelectric Thin Film," 235(1-4) J. Crystal Growth 401-406 (Feb. 2002).

Non-final Office Action in U.S. Appl. No. 13/580,061 (dated Sep. 2, 2014).

* cited by examiner

A: (l, m, n)=(0.26, 0.19, 0.55)
B: (l, m, n)=(0.09, 0.36, 0.55)
C: (l, m, n)=(0.09, 0.64, 0.27)
D: (l, m, n)=(0.23, 0.64, 0.13)
E: (l, m, n)=(0.49, 0.38, 0.13)
F: (l, m, n)=(0.49, 0.19, 0.32)

PIEZOELECTRIC ELEMENT, LIQUID DISCHARGE HEAD AND LIQUID DISCHARGE APPARATUS

BACKGROUND OF THE INVENTION

1. Field of the Invention

The present invention relates to a piezoelectric element and a liquid discharge head, and more particular, to a lead-free piezoelectric element including an oriented piezoelectric film.

2. Description of the Related Art

A piezoelectric element is typically formed of a bulk-shaped or film-shaped piezoelectric material including a lower electrode and an upper electrode.

As a piezoelectric material, $ABO_3$ type ceramics such as lead zirconate titanate (hereinafter referred to as "PZT") is generally used. However, PZT contains lead at an A-site of a perovskite skeleton. Therefore, the environmental impact of the lead component is considered to be a problem. In order to address this problem, a piezoelectric material and a piezoelectric element each using a lead-free perovskite-type metal oxide have been proposed.

For example, as a piezoelectric material formed of a lead-free perovskite-type oxide, "Chemistry of Materials" 2006, Vol. 18, No. 21, pp. 4987-4989 describes $Bi(Zn_{0.5}Ti_{0.5})O_3$. However, although the $Bi(Zn_{0.5}Ti_{0.5})O_3$ is theoretically expected to have excellent piezoelectric performance, it is difficult to polarize the $Bi(Zn_{0.5}Ti_{0.5})O_3$ due to its high Curie temperature, and hence the piezoelectric performance thereof has not been clarified. Further, there has yet been no report of successful synthesis of film-shaped $Bi(Zn_{0.5}Ti_{0.5})O_3$.

There have been proposed a piezoelectric material containing $BiFeO_3$ as a main component as another piezoelectric material formed of the lead-free perovskite-type oxide, and a piezoelectric element using the piezoelectric material. For example, Japanese Patent Application Laid-Open No. 2007-287739 discloses a $BiFeO_3$-based piezoelectric material containing La in an A-site and a piezoelectric element using the piezoelectric material. $BiFeO_3$ is a satisfactory ferroelectric substance, and is reported to exhibit a large remnant polarization at low temperature. However, there remains a problem in that sufficient piezoelectric strain cannot be obtained from $BiFeO_3$.

Further, "Chemistry of Materials" 2007, Vol. 19, No. 26, pp. 6385-6390 discloses a $BiAlO_3$ piezoelectric material obtained by a high-pressure synthesis method. However, the piezoelectric performance of $BiAlO_3$ has also not reached a practically applicable range yet.

SUMMARY OF THE INVENTION

The present invention has been made to cope with such problems, and provides a piezoelectric element having large piezoelectric strain and a liquid discharge head.

In order to solve the above-mentioned problems, according to a first aspect of the present invention, there is provided a piezoelectric element, including, on a substrate: a piezoelectric film; and a pair of electrodes provided in contact with the piezoelectric film; in which the piezoelectric film includes a perovskite-type metal oxide represented by the following general formula (1) as a main component:

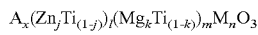

General Formula (1)

where A represents one of a Bi element, and one or more kinds of elements selected from trivalent metal elements and containing at least a Bi element; M represents at least one kind of element selected from Fe, Al, Sc, Mn, Y, Ga, and Yb; and $0.9 \le x \le 1.25$, $0.4 \le j \le 0.6$, $0.4 \le k \le 0.6$, $0.09 \le l \le 0.49$, $0.19 \le m \le 0.64$, $0.13 \le n \le 0.55$, and $l+m+n=1$ are satisfied, the perovskite-type metal oxide is uniaxially (111)-oriented in pseudo-cubic notation in a thickness direction, of the pair of electrodes, a lower electrode provided on the substrate side is a multilayer electrode including at least a first electrode layer in contact with the substrate and a second electrode layer in contact with the piezoelectric film, and the second electrode layer is a perovskite-type metal oxide electrode which is uniaxially (111)-oriented in pseudo-cubic notation in a thickness direction.

In a liquid discharge head of the present invention that solves the above-mentioned problems, the liquid discharge head includes a liquid reservoir including a vibrating unit that includes the above-mentioned piezoelectric element, and a discharge port in communication with the liquid reservoir.

In a liquid discharge apparatus of the present invention that solves the above-mentioned problems, the liquid discharge apparatus includes a transport unit configured to transport a recording medium and the above-mentioned liquid discharge head.

According to the present invention, it is possible to provide the piezoelectric element, the liquid discharge head, and the liquid discharge apparatus having large piezoelectric strain.

Further, the piezoelectric element of the present invention has very little effect on an environment because the material does not use lead. In addition, the piezoelectric element of the present invention is excellent in interlayer adhesion, and is therefore advantageous also in terms of continuous driving durability when used in the liquid discharge head.

Further features of the present invention will become apparent from the following description of exemplary embodiments with reference to the attached drawings.

DESCRIPTION OF THE EMBODIMENTS

Figure 1A:
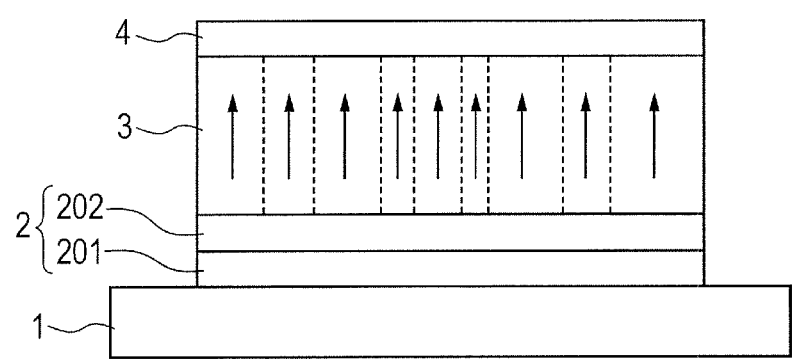
FIG. 1A is a schematic vertical sectional view illustrating an example of a piezoelectric element according to an embodiment of the present invention.

Now, a mode for carrying out the present invention is described.

The present invention provides a piezoelectric element having large piezoelectric strain, which uses a piezoelectric film based on a bismuth-based perovskite-type metal oxide. It is to be noted that the piezoelectric element of the present invention can find use in a variety of applications such as a capacitor material, a memory material, and a sensor material by utilizing the properties of the metal oxide as a dielectric material.

In order to solve the above-mentioned problems, according to a first aspect of the present invention, there is provided a piezoelectric element, including, on a substrate: a piezoelectric film; and a pair of electrodes provided in contact with the piezoelectric film; in which the piezoelectric film includes a perovskite-type metal oxide represented by the following general formula (1) as a main component:

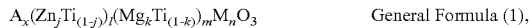

$$A_x(Zn_jTi_{(1-j)})_l(Mg_kTi_{(1-k)})_mM_nO_3 \quad \text{General Formula (1)},$$

the perovskite-type metal oxide is uniaxially (111)-oriented in pseudo-cubic notation in a thickness direction, of the pair of electrodes, a lower electrode provided on the substrate side is a multilayer electrode including at least a first electrode layer in contact with the substrate and a second electrode layer in contact with the piezoelectric film, and the second electrode layer is a perovskite-type metal oxide electrode which is uniaxially (111)-oriented in pseudo-cubic notation in a thickness direction.

The piezoelectric film contains the metal oxide represented by the general formula (1) as a main component. The effects of the present invention are more exerted as the content ratio of the metal oxide in the piezoelectric film is closer to 100%. However, the piezoelectric film may contain a component other than the general formula (1) (hereinafter referred to as additive) as long as the properties are not varied. The additive is preferably smaller than 1.0 part by weight in total with respect to 100 parts by weight of the metal oxide represented by the general formula (1). When the additive exceeds 1.0 part by weight, the piezoelectricity and the insulation property of the piezoelectric film may deteriorate.

In the general formula (1): A represents a Bi element, or one or more kinds of elements selected from trivalent metal elements and containing at least a Bi element; M represents at least one kind of element selected from Fe, Al, Sc, Mn, Y, Ga, and Yb; and $0.9 \le x \le 1.25$, $0.4 \le j \le 0.6$, $0.4 \le k \le 0.6$, $0.09 \le l \le 0.49$, $0.19 \le m \le 0.64$, $0.13 \le n \le 0.55$, and $l+m+n=1$ are satisfied.

The foregoing can translate into the fact that l, m, and n fall within the range surrounded by coordinate points A, B, C, D, E, F, and A. It is to be noted that lines connecting the respective coordinate points are included in the above-mentioned range.

Specific values for l, m, and n of each coordinate point are as described below.

A: (l, m, n)=(0.26, 0.19, 0.55)
B: (l, m, n)=(0.09, 0.36, 0.55)
C: (l, m, n)=(0.09, 0.64, 0.27)
D: (l, m, n)=(0.23, 0.64, 0.13)
E: (l, m, n)=(0.49, 0.38, 0.13)
F: (l, m, n)=(0.49, 0.19, 0.32)

Figure 3:
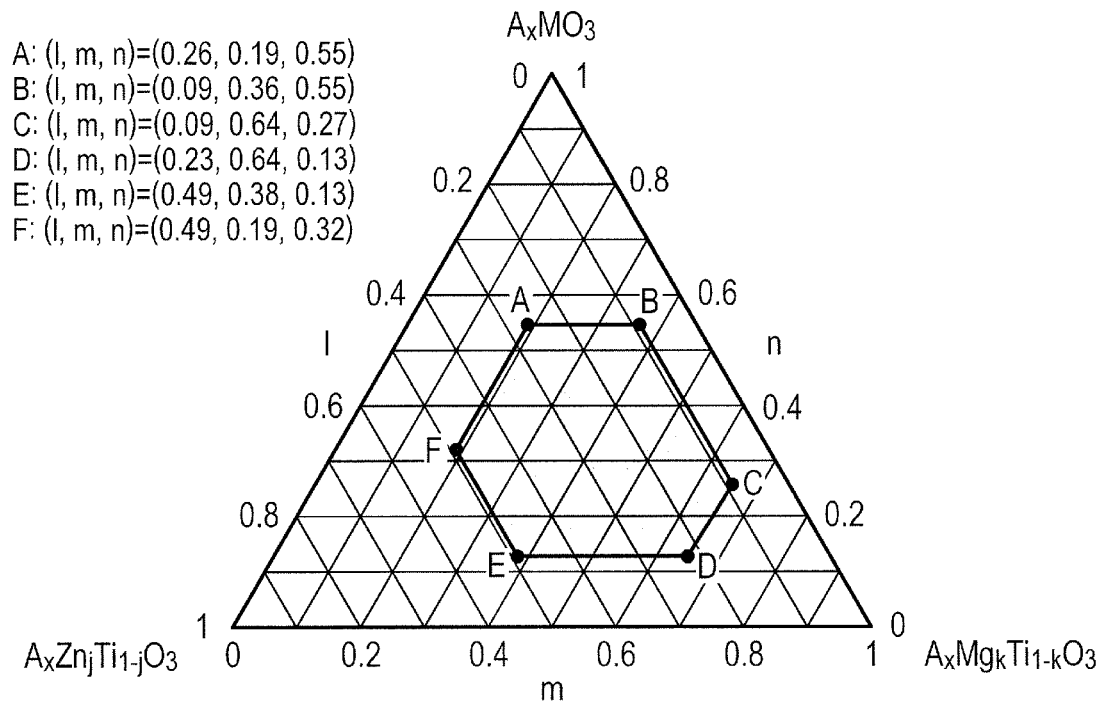
FIG. 3 is a ternary phase diagram illustrating the composition range of a perovskite-type metal oxide constituting the piezoelectric element of the present invention.

FIG. 3 is a ternary phase diagram illustrating the composition range of the perovskite-type metal oxide constituting the piezoelectric element of the present invention. A colored portion surrounded by the coordinate points A, B, C, D, E, F, and A is the composition range of the metal oxide to be used for the piezoelectric element of the present invention, and the piezoelectric element of the present invention in the composition range shows excellent piezoelectric property. Filled circles and solid lines mean that the circles and the lines are included in the composition range.

The term "perovskite-type metal oxide" as herein employed refers to a metal oxide having a perovskite-type structure, which is ideally a cubic structure, as described in Iwanami Dictionary of Physics and Chemistry, 5th Edition (Iwanami Shoten, Publishers, Feb. 20, 1998). The metal oxide having the perovskite-type structure is generally represented by the chemical formula $ABO_3$. The elements A and B in the perovskite-type oxide each act in the form of an ion and occupy specific positions of a crystal unit cell called A-site and B-site, respectively. In a crystal unit cell of a cubic crystal system, for example, the element A is positioned at a vertex of a cube and the element B is positioned at the body center of the cube. The elements O act as oxygen anions and occupy face-centered positions. The fact that the metal oxide has the perovskite-type structure may be confirmed by, for example, subjecting a piezoelectric film portion to structural analysis by X-ray diffraction or electron beam diffraction.

The metal oxide represented by the general formula (1) refers to a solid solution of three kinds of perovskite-type metal oxides represented by $A(Zn_jTi_{(1-j)})O_3$, $A(Mg_kTi_{(1-k)})O_3$, and $AMO_3$. When a component of each solid solution is described herein, the component is described by omitting the subscript x representing the degree of excess or insufficiency of A. In the general formula (1), A is a metal element positioned mainly at the A site of the perovskite-type structure, and $(Zn_jTi_{(1-j)})$, $(Mg_kTi_{(1-m)})$, and M are each an element positioned mainly at the B site of the structure.

In the general formula (1), A is formed of a Bi element alone, or one or more kinds of elements selected from trivalent metal elements and containing at least a Bi element. In this case, the $A(Zn_jTi_{(1-j)})O_3$ single substance adopts a tetragonal structure having a large aspect ratio, and the $A(Mg_kTi_{(1-k)})O_3$ single substance adopts an orthorhombic structure serving as a non-tetragonal structure. It is to be noted that the aspect ratio represents the magnitude of the shape anisotropy of a unit cell and the aspect ratio of the tetragonal structure represents a ratio c/a of the length of the c-axis of a unit cell to the length of the a-axis of the unit cell.

In the general formula (1), x representing the abundance of an A-site element satisfies the relationship of $0.9 \le x \le 1.25$, preferably $0.98 \le x \le 1.15$. When x equals 1, the A site and the B site are equal to each other in number of metals, and hence a metal oxide having good insulation property can be obtained. On the other hand, when x is smaller than 0.9, the insufficiency of the A-site element may be responsible for a defective site, thereby adversely affecting the insulation property. In contrast, when x is larger than 1.25, an oxide of the excessive A-site element precipitates on a crystal grain boundary, and hence the oxide may be responsible for a current leak at the time of the application of a high voltage.

In the general formula (1), j representing the ratio of Zn to Ti satisfies the relationship of $0.4 \le j \le 0.6$, preferably $0.45 \le j \le 0.55$. The most preferred value of j is 0.5. When Zn is present as a divalent cation and Ti is present as a tetravalent cation in a crystal lattice, as the balance of charge is good when j is 0.5, the insulation property of the entire oxide is enhanced. However, depending upon the kinds of the B-site element and a dopant, j may be changed in a range of 0.4 to 0.6 for the purpose of enhancing the insulation property.

Similarly, in the general formula (1), k representing the ratio of Mg to Ti satisfies the relationship of $0.4 \le x \le 0.6$, preferably $0.45 \le x \le 0.55$. The most preferred value of k is 0.5. When Mg is present as a divalent cation and Ti is present as a tetravalent cation in a crystal lattice, as the balance of charge is good when k is 0.5, the insulation property of the entire oxide is enhanced. However, depending upon the kinds of the B-site element and a dopant, k may be changed in a range of 0.4 to 0.6 for the purpose of enhancing the insulation property.

M is selected from Fe, Al, Sc, Mn, Y, Ga, and Yb in the general formula (1), and a combination thereof. More preferably, in the general formula (1), M is formed of at least one of Fe and Al, or both the elements. When the metal ion is selected as M, an $AMO_3$ single substance mainly adopts a rhombohedral structure, i.e., a non-tetragonal structure.

When $A(Zn_jTi_{(1-j)})O_3$ having a tetragonal structure in a single substance and $AMO_3$ having a non-tetragonal structure in a single substance are formed into a solid solution together, the piezoelectric effect of the solid solution with respect to an external electric field increases. The foregoing results from the fact that a polarization moment in the (001)-axis direction of the tetragonal structure switches with a polarization moment in the (111)-axis direction of the rhombohedral structure. The same holds true for such a metal oxide that only one of a tetragonal structure and a rhombohedral structure is observed in a solid solution. For example, even in the case of a piezoelectric metal oxide formed of a single phase having only a perovskite-type tetragonal structure in a static state, the switching between the polarization moments is induced by an external electric field as long as the metal oxide is a solid solution with a piezoelectric metal oxide having a rhombohedral structure.

It is to be noted that a solid solution of a tetragonal structure having a large aspect ratio and a rhombohedral structure has so large a difference in volume between their respective unit cells that an energy barrier to the switching is high. In view of the foregoing, in the present invention, the aspect ratio of the tetragonal structure is suppressed by solid-dissolving $A(Mg_kTi_{(1-k)})O_3$ in addition to a binary solid solution of $A(Zn_jTi_{(1-j)})O_3$ and $AMO_3$. As a result, the energy barrier to the switching between the rhombohedral structure and the tetragonal structure becomes small, and hence piezoelectricity is improved.

Mg is selected for suppressing the aspect ratio of the tetragonal structure of $A(Zn_jTi_{(1-j)})O_3$ because Mg is similar in ionic radius to Zn and its d orbital has a low electron density. Solid-dissolving $A(Mg_kTi_{(1-k)})O_3$ in $A(Zn_jTi_{(1-j)})O_3$ can suppress the aspect ratio while maintaining the tetragonal structure of $A(Zn_jTi_{(1-j)})O_3$.

In the general formula (1), m representing a ratio of the amount in which $A(Mg_kTi_{(1-k)})O_3$ is solid-dissolved satisfies the relationship of $0.19 \leq m \leq 0.64$, preferably $0.24 \leq m \leq 0.64$. When m is smaller than 0.19, a suppressing effect on the aspect ratio cannot be obtained, and hence the piezoelectricity may be insufficient. In contrast, when m is larger than 0.64, the tetragonal structure of $A(Zn_jTi_{(1-j)})O_3$ cannot be exploited for the piezoelectricity in some cases. Setting m within the range of $0.19 \leq m \leq 0.64$ establishes a balance between the amplitude of the switching between the polarization moments and the energy barrier, and hence the piezoelectricity can be improved most effectively.

In the general formula (1), l representing a ratio of the amount in which $A(Zn_jTi_{(1-j)})O_3$ is solid-dissolved satisfies the relationship of $0.09 \leq l \leq 0.49$, preferably $0.09 \leq l \leq 0.38$. When l is smaller than 0.09, the tetragonal structure of $A(Zn_jTi_{(1-j)})O_3$ cannot be exploited for the piezoelectricity in some cases. In contrast, when l is larger than 0.49, stability as a metal oxide reduces, and hence a non-perovskite-type impurity phase such as a bismuth layer structure may appear.

A ratio between the amounts in which $A(Mg_kTi_{(1-k)})O_3$ and $A(Zn_jTi_{(1-j)})O_3$ are solid-dissolved can be represented by $m/(l+m)$. When the ratio between the amounts in which $A(Mg_kTi_{(1-k)})O_3$ and $A(Zn_jTi_{(1-j)})O_3$ are solid-dissolved satisfies the relationship of $0.34 \leq m/(l+m) \leq 0.88$, preferably $0.48 \leq m/(l+m) \leq 0.80$, the metal oxide in the piezoelectric element of the present invention has particularly large piezoelectric property.

In the general formula (1), n representing the ratio of the amount in which $AMO_3$ is solid-dissolved satisfies the relationship of $0.13 \leq n \leq 0.55$, preferably $0.13 \leq n \leq 0.48$. Setting n within the range of $0.13 \leq n \leq 0.55$ allows the entirety of the perovskite-type metal oxide constituting the piezoelectric film to adopt a tetragonal structure or a monoclinic structure, and hence the strain of the piezoelectric film increases.

It is preferred that A in the general formula (1) contain only a Bi element, or a Bi element and at least one or more kinds of elements selected from trivalent lanthanoids.

When A is formed of only trivalent metal elements mainly containing Bi, a perovskite skeleton formed of the A-site elements and an O element becomes stable electrically.

When A is formed of only a Bi element, the symmetry of a perovskite skeleton constituted of the A-site element and an O element increases, and hence the stability of the metal oxide with respect to an external stimulus is enhanced. Further, effects of raising the Curie temperature of the piezoelectric metal oxide and enlarging a fluctuation range of internal polarization due to the strong bonding peculiar to the Bi element are obtained.

In the case where the piezoelectric film is used after being subjected to polarization treatment from outside, or in the case where the piezoelectric element of the present invention is used at low temperature, it is preferred that A contain a trivalent lanthanoid element in addition to Bi for the purpose of adjusting the Curie temperature.

Examples of the trivalent lanthanoid element include La, Ce, Pr, Nd, Sm, Eu, Dy, Tm, and Yb. Of those, an La element is most preferred out of the lanthanoid elements to be contained in A. An La element is similar in ionic radius to Bi, and hence is excellently solid-dissolved in the system of the material of the present invention. Accordingly, a single phase of a perovskite-type structure can be easily obtained.

When A contains at least a Bi element and a lanthanoid element, such as an La element, the ratio of Bi occupying A is preferably 70 mol % or more and 99.9 mol % or less, particularly preferably 90 mol % or more and 99.9 mol % or less. When the ratio of Bi occupying A is less than 70 mol %, the insulation property of the piezoelectric film may be degraded. In contrast, when the ratio of Bi occupying A exceeds 99.9 mol %, performance almost equal to that in the case where a lanthanoid element is not added is obtained.

It is to be noted that the term "mol %" as herein employed refers to the amount of substance of a specified element with respect to the total amount of substance occupying a specified site by a percentage.

The Curie temperature desired in the piezoelectric film of the present invention is 200° C. or more and less than 600° C., more preferably 200° C. or more and 500° C. or less. When the Curie temperature is equal to or higher than 200° C., in the case where the piezoelectric film is used in a device, a material with less fluctuation in characteristics depending upon temperature can be provided. Further, when the Curie temperature is lower than 600° C., a material having large piezoelectric strain at room temperature can be provided. Generally, as the ratio of a lanthanoid element contained in A is larger, the Curie temperature tends to be lower.

Further, incorporating a moderate amount of Mn into the piezoelectric film of the present invention improves the insulation property of the piezoelectric film. A highly insulative piezoelectric film has an advantage in that the film can withstand the application of a high voltage at the time of straining the piezoelectric element, and is also excellent in conversion efficiency between electric energy and mechanical energy. In addition, incorporating a moderate amount of Mn into the piezoelectric film of the present invention exerts an effect by which the piezoelectric element can be driven with an additionally low voltage.

A raw material to be used when Mn is incorporated into the piezoelectric film of the present invention may be divalent Mn, or may be tetravalent Mn. The same effects can be expected when an Mn element is contained in a crystal grain boundary as an oxide, as well as when an Mn element is contained in the B site of the perovskite-type structure.

In the general formula (1), M can contain 0.1 mol % or more and 5 mol % or less, in particular, 0.1 mol % or more and 1 mol % or less of the Mn element. When the content of Mn in M is smaller than 0.1 mol %, the extent to which the insulation property is improved becomes small. In contrast, when the content of Mn in the B site is larger than 5 mol %, the piezoelectric strain of the piezoelectric film may become small.

In the piezoelectric element of the present invention, the crystal system of the perovskite-type metal oxide represented by the general formula (1) preferably contains at least a monoclinic structure. Examples of the crystal system containing at least a monoclinic structure include a mixed system having a tetragonal structure and a monoclinic structure, a mixed system having a rhombohedral structure and a monoclinic structure, a mixed system having a tetragonal structure, a rhombohedral structure, and a monoclinic structure, and a crystal system having only a monoclinic structure as the perovskite-type structure. A more preferred crystal system is a crystal system having only a monoclinic structure.

In the present invention, a monoclinic structure, a rhombohedral structure, and a tetragonal structure are defined as follows, provided that Symbol "=" in the following indicates "to be substantially equal." Symbol "≠" indicates "not to be equal." A β-angle represents an angle formed by the a-axis and c-axis of a crystal lattice.

Rhombohedral structure: a-axis length=c-axis length, and β-angle≠90°
Monoclinic structure: a-axis length≠c-axis length, and β-angle≠90°
Tetragonal structure: a-axis length≠c-axis length, and β-angle=90°

As described above, in the present invention, the aspect ratio of the tetragonal structure is suppressed by solid-dissolving $A(Mg_kTi_{(1-k)})O_3$ in addition to the binary solid solution of $A(Zn_jTi_{(1-j)})O_3$ and $AMO_3$. As a result, the energy barrier to the switching between the rhombohedral structure and the tetragonal structure becomes small, and hence the piezoelectricity is improved.

In addition to the main mechanism, the energy barrier to the switching between the respective structures becomes additionally small when the crystal system of the perovskite-type metal oxide represented by the general formula (1) includes a monoclinic structure. This probably results from the fact that the unit cell of the monoclinic structure is intermediate in volume between the unit cell of the rhombohedral structure and the unit cell of the tetragonal structure, and the fact that the unit cell of the monoclinic structure has a polarization moment in its (110)-axis direction. That is, the piezoelectric film constituting the piezoelectric element of the present invention becomes able to easily switch polarization moments so as to rotate in three directions, i.e., a (001) axis, a (110) axis, and a (111) axis. As a result, a displacement amount by a piezoelectric phenomenon per intensity of an external electric field increases. That is, a piezoelectric constant increases.

The perovskite-type metal oxide is uniaxially (111)-oriented in pseudo-cubic notation in the thickness direction of the piezoelectric film. The perovskite-type metal oxide constituting the piezoelectric film of the present invention has any one of the tetragonal, orthorhombic, monoclinic, rhombohedral, and cubic crystal systems, or has multiple crystal systems selected therefrom at a time. For simple notation, however, the index of the crystal system is herein regarded as a pseudo-cubic crystal unless otherwise noted. In other words, the (111) plane is a notation when a unit cell of a crystal is regarded as a cubic crystal.

In the field of crystallography, different notations such as (hkl), [hkl], {hkl}, and <hkl> are used. However, the (hkl) notation is consistently used in the description herein because a unit cell of a crystal is regarded as a cubic crystal. The "oriented" as used herein means the state where the entire or part of a target crystal plane is aligned in a specific direction. Further, the "uniaxially oriented" means the state where the crystal is oriented when observed only in specific one direction, provided that the state where an ideal single crystal is oriented when observed from any directions is regarded as triaxially oriented. In other words, the state where the metal oxide is uniaxially (111)-oriented in pseudo-cubic notation in the thickness direction means the state where most part of the crystal plane represented by (111) is aligned horizontally to the thickness direction. This state can translate also to the state where most of the axes perpendicular to the (111) plane are oriented in the thickness direction.

The oriented state of a piezoelectric film made of a perovskite-type metal oxide can be easily observed based on the detection angle and intensity of a diffraction peak in X-ray diffraction measurement (for example, 2θ/θ method), which is typically used for a crystal thin film. In a diffraction chart obtained from a thin film material selectively oriented in the (hkl) plane, the intensity of a diffraction peak detected for an angle corresponding to the (hkl) plane is significantly larger than the total intensity of peaks detected for angles corresponding to other planes.

For example, as described in "Japanese Journal of Applied Physics", 1999, vol. 38, pp. 5505-5511, a crystalline body made of a perovskite-type metal oxide forms an engineered domain structure when applied with a voltage in the <111> direction, and satisfactory piezoelectricity is obtained. In other words, it is known that a (111)-oriented piezoelectric film has a larger piezoelectric constant than a non-oriented piezoelectric film and a piezoelectric film oriented in another plane.

In the case where a piezoelectric film made of a perovskite-type metal oxide is oriented in a specific plane, the oriented state thereof can be confirmed to be a uniaxial orientation rather than a triaxial orientation by a crystal analysis method such as X-ray diffraction measurement. For example, a technique called in-plane method can be used to distinguish the uniaxial orientation and the triaxial orientation by observing a rocking curve of the piezoelectric film surface in a manner that the detector is fixed to an angle corresponding to the (hkl) plane of the metal oxide. Alternatively, the uniaxial orientation and the triaxial orientation can be distinguished also by X-ray polefigure measurement in a manner that the detector is fixed to the angle corresponding to the (hkl) plane of the metal oxide. Diffraction resulting from the (111) plane in the case of the triaxial orientation is observed as point diffraction. Diffraction resulting from the (111) plane in the case of the uniaxial orientation is observed as ring diffraction.

Further, in the piezoelectric film of the piezoelectric element of the present invention, the Lotgering factor F indicating the degree of orientation of the (111) plane in the thickness direction of the piezoelectric film is preferably 0.50 or more and 1.00 or less in the X-ray diffraction measurement by the 2θ/θ method. The more desired lower limit value of the Lotgering factor F is 0.70. Although there are some indices indicating the degree of orientation, the Lotgering factor F is used herein. A Lotgering factor F of more than 0 means that a target crystal plane is oriented.

When the Lotgering factor F is smaller than 0.50, an effective domain that can contribute to the piezoelectric effect is reduced, and the piezoelectric constant is not increased enough as compared with the non-oriented state. As the Lotgering factor F is closer to 1.00, an effective domain that can contribute to the piezoelectric effect is increased, and hence the piezoelectric constant of piezoelectric ceramics becomes larger. When the Lotgering factor F is 1.00, a diffraction peak is detected only from a target crystal plane. In other words, this indicates that all crystals at a level detectable by an X-ray diffraction method are oriented and aligned in a target azimuth. The Lotgering factor F is calculated by X-ray diffraction 2θ/θ measurement. For example, the Lotgering factor F is calculated by Expression 1 using an integrated peak intensity of an X-ray diffracted from a target crystal plane in the range of 2θ of 10° to 80°. The range of 2θ may be narrowed as necessary, but the calculation accuracy deteriorates unless the range includes a diffraction peak for at least 20° to 60°.

$$F=(\rho-\rho_0)/(1-\rho_0) \quad \text{(Expression 1)}$$

$\rho_0$ is calculated by using an X-ray diffraction intensity ($I_0$) of a non-oriented sample. In the case of the (111) orientation, $\rho_0$ is calculated from Expression 2 as the ratio of a total diffraction intensity of the (111) plane and the (222) plane to the sum of all diffraction intensities.

$$\rho_0=\Sigma I_0(111)/\Sigma I_0(hkl) \quad \text{(Expression 2)}$$

$\rho$ is calculated by using an X-ray diffraction intensity (I) of an oriented sample. In the case of the (111) orientation, $\rho$ is calculated from Expression 3 similarly to Expression 2 above as the ratio of a total diffraction intensity of the (111) plane and the (222) plane to the sum of all diffraction intensities.

$$\rho=\Sigma I(111)/\Sigma I(hkl) \quad \text{(Expression 3)}$$

The piezoelectric film is preferably an aggregate of columnar crystals grown from one of the pair of electrodes in contact with the piezoelectric film. The columnar crystals are more desirably grown from the perovskite-type metal oxide electrode. The crystals of the metal oxide uniaxially (111)-oriented in the thickness direction are integrally grown in the thickness direction to form columnar crystals, and hence the piezoelectric element of the present invention has a larger strain. The growth of columnar crystals from the electrode can be easily determined by observing the cross section of the piezoelectric film through a transmission electron microscope to observe that the crystals grown in a columnar shape are in contact with the electrode.

The piezoelectric film has a thickness of preferably 150 nm or more and 10 μm or less, more preferably 200 nm or more and 3 μm or less. When the thickness of the piezoelectric film is set to 150 nm or more and 10 μm or less, an electromechanical conversion function sufficient as a piezoelectric element can be obtained and an increase in density of the piezoelectric element of the present invention can be expected.

The piezoelectric film is characterized in its component composition, crystal orientation state, and crystal structure, and a production method therefor is not particularly limited. Examples of the method include a metal organic chemical vapor deposition method (MOCVD method), a chemical solution deposition method (CSD method), a pulse laser deposition method (PLD method), a sputtering method, a hydrothermal synthesis method, and an aerosol deposition method (AD method). Of those, the preferred production method is the metal organic chemical vapor deposition method, the chemical solution deposition method, or the pulse laser deposition method. The metal organic chemical vapor deposition method, the chemical solution deposition method, and the pulse laser deposition method are each a film formation method excellent in precise control of a metal composition.

The term "metal organic chemical vapor deposition method (MOCVD method)" as herein employed refers to a generic name for film formation methods with which an intended metal oxide is grown on a substrate by thermal decomposition of a metal organic compound delivered by a carrier gas. The term "metal organic chemical vapor deposition method" comprehends a film formation method generally called metal organic vapor phase epitaxy method, MOCVD method, or MOVPE method.

The term "chemical solution deposition method (CSD method)" as herein employed refers to a generic term for film formation methods with which an intended metal oxide is obtained by applying a precursor solution of the intended metal oxide onto a substrate, followed by heating and crystallization. The term "chemical solution deposition method" comprehends a film formation method generally called sol-gel method or metal organic decomposition method.

A metal compound to be included in a precursor solution used in the MOCVD method or the CSD method is, for example, a hydrolyzable or thermally decomposable metal organic compound. Typical examples thereof include a metal alkoxide of a metal contained in an intended material, an organic acid salt of the metal, and a metal complex such as a β-diketone complex of the metal.

The term "pulse laser deposition method (PLD method)" as herein employed refers to a generic name for film formation methods with which a metal oxide is grown from the vapor on the substrate by using plasma which is generated when a pulse laser within several tens of nanoseconds (ns) enters a target material. The term "pulse laser deposition method" comprehends a film formation method generally called pulse laser vapor deposition method, pulse laser film formation method, laser ablation method, or molecular beam epitaxy method.

The target material to be used in the PLD method may be a sintered body identical in composition to the intended metal oxide, or may be a multiple system grouped into metal species having different film formation rates.

The piezoelectric element according to the present invention includes at least the piezoelectric film and a pair of electrodes provided in contact with the piezoelectric film. Further, a lower electrode on a substrate side out of the pair of electrodes is a multilayer electrode including at least a first electrode layer in contact with the substrate and a second electrode layer in contact with the piezoelectric film.

Figure 1B:
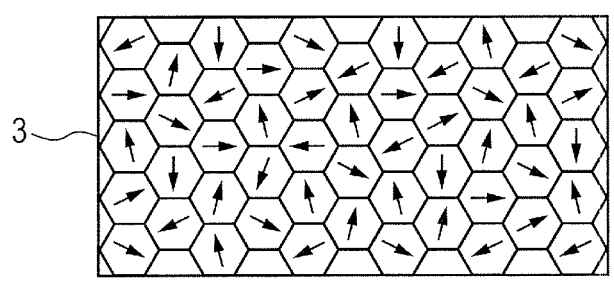
FIG. 1B is a schematic horizontal sectional view illustrating an example of the piezoelectric element according to the embodiment of the present invention.

FIGS. 1A and 1B are each a schematic sectional view illustrating an example of the piezoelectric element according to an embodiment of the present invention. In FIGS. 1A and 1B, the piezoelectric element includes a substrate 1, a lower electrode 2, a piezoelectric film 3, and an upper electrode 4. The piezoelectric element according to the present invention includes, on the substrate 1, the piezoelectric film 3 and a pair of the lower electrode 2 and the upper electrode 4 provided in contact with the piezoelectric film 3. The lower electrode 2 includes a first electrode layer 201 in contact with the substrate 1 and a second electrode layer 202 in contact with the piezoelectric film 3. Although not illustrated, another kind of electrode layer may be provided between the first electrode layer 201 and the second electrode layer 202. The material for the another kind of electrode layer is not limited as long as the material does not hinder electrical conduction between the first electrode layer 201 and the second electrode layer 202. The material may be a metal or a conductive oxide. A more preferred material for the another kind of electrode layer is a metal having a face-centered cubic lattice structure or a conductive perovskite-type metal oxide.

Although a material for the substrate 1 is not particularly limited, a material that neither deforms nor melts in a baking process to be typically performed at 800° C. or less is preferred. For example, a single crystal substrate formed of magnesium oxide (MgO), strontium titanate ($SrTiO_3$), or the like, a ceramic substrate formed of zirconia ($ZrO_2$), alumina ($Al_2O_3$), silica ($SiO_2$), or the like, a semiconductor substrate formed of silicon (Si), tungsten (W), or the like, or a heat-resistant stainless steel (SUS) substrate is preferably used. Of those, a silicon substrate is the most preferred substrate material because a so-called silicon process that can finely process the piezoelectric element of the present invention is applicable. A silica ($SiO_2$) layer or a silicon nitride (SiN) layer may be provided on the surface of the silicon substrate as a diaphragm that functions when the piezoelectric element of the present invention is used as a piezoelectric actuator. As the silicon substrate, a silicon-on-insulator (SOI) substrate may be used.

The second electrode layer 202 is a perovskite-type metal oxide electrode. Examples of the perovskite-type metal oxide that can be used for the second electrode layer 202 include $M1RuO_3$ (M1 represents at least one kind selected from the group consisting of Sr, Ba, and Ca), $LaNiO_2$, and $Sr_{(1-z)}M2_zCoO_3$ (M2 represents at least one kind selected from the group consisting of La, Pr, Sm, and Nd, and z is $0 \leq z < 1$). Of those, $M1RuO_3$ is a perovskite-type metal oxide suitable for the piezoelectric element of the present invention. $M1RuO_3$ is excellent in conductivity and temperature stability among conductive metal oxides, and is also excellent in adhesion with the piezoelectric film 3 and the first electrode layer 201.

A method of producing the second electrode layer 202 is not particularly limited. Examples of the method include, similarly to the piezoelectric film 3, an MOCVD method, a CSD method, a PLD method, a sputtering method, a hydrothermal synthesis method, and an AD method. Of those, the sputtering method and the CSD method are excellent in composition controllability and can form a highly dense electrode layer, and hence a perovskite-type metal oxide electrode excellent in conductivity can be produced.

The second electrode layer 202 is uniaxially (111)-oriented in pseudo-cubic notation in the thickness direction of the piezoelectric film 3. Both of the piezoelectric film 3 and the second electrode layer 202 in contact with the piezoelectric film are uniaxially (111)-oriented, thus improving the matching of crystal units at the interface between the piezoelectric film 3 and the second electrode layer 202. As a result, a loss of an applied voltage during element driving at the interface is reduced, and the piezoelectric strain of the element is increased. Further, the adhesion at the interface is high, and hence satisfactory durability is obtained in continuous driving of the element. Also focusing on the production of the element, it is possible to easily form the uniaxially (111)-oriented piezoelectric film 3 having high crystallinity on the surface of the uniaxially (111)-oriented second electrode layer 202.

"Journal of Crystal Growth", 2002, vol. 235, pp. 401-406 discloses that the electric resistance value of a (111)-oriented perovskite-type oxide electrode is relatively smaller than that of a (100)-oriented or (110)-oriented electrode having the same composition. Also in terms of such low resistance, it can be said that the uniaxial (111) orientation is advantageous for the second electrode layer 202.

The Lotgering factor F indicating the degree of orientation of the (111) plane in the thickness direction of the second electrode layer 202 is preferably 0.50 or more and 1.00 or less. The more desired lower limit value of the Lotgering factor F is 0.70. The method of calculating the Lotgering factor F is similar to that for the piezoelectric film 3.

When the Lotgering factor F is smaller than 0.50, the strain and the durability of the piezoelectric element may deteriorate. Further, as the Lotgering factor F is closer to 1.00, the strain and the durability of the piezoelectric element are improved, and the conductivity of the lower electrode 2 is also improved.

The second electrode layer 202 has a thickness of 5 nm or more and 200 nm or less, more preferably 10 nm or more and 100 nm or less, still more preferably 10 nm or more and 50 nm or less. When the thickness of the second electrode layer 202 is less than 5 nm, an excessive stress may occur at the interface with the piezoelectric film 3, and the film may peel off in continuous driving. On the other hand, when the thickness of the second electrode layer 202 exceeds 200 nm, the resistance value of the lower electrode 2 as a whole may be excessively increased to reduce the strain of the piezoelectric element.

The first electrode layer 201 is formed of a conductive layer having a thickness of about 5 nm to about 2,000 nm. The material therefor is not limited, but is preferably a metal electrode in terms of conductivity. Examples of the metal electrode include metals such as Ti, Pt, Ta, Ir, Sr, In, Sn, Au, Al, Fe, Cr, Ni, Pd, Ag, and Cu and an alloy thereof.

Of those metal electrodes, the first electrode layer 201 is preferably selected from a material having a face-centered cubic lattice structure in an operating temperature region of the piezoelectric element of the present invention, typically at 25° C. When the first electrode layer 201 has a face-centered cubic lattice structure, the matching at the interface with the second electrode layer 202 is improved. As a result, a loss of an applied voltage during element driving inside the lower electrode 2 is reduced, and the piezoelectric strain of the element is increased. Further, the adhesion at the interface is high, and hence satisfactory durability is obtained in continuous driving of the element. Also focusing on the production of the element, it is possible to easily form the uniaxially (111)-oriented second electrode layer 202 on the surface of the first electrode layer 201 having a face-centered cubic lattice structure.

Examples of the material for the metal electrode having stability in the production temperature of the piezoelectric element and having a face-centered cubic lattice structure at 25° C. include Pt, Ni, Pd, and Ir. Of those, the most preferred material is an electrode containing platinum (Pt) which is (111)-oriented in the thickness direction as a main component in terms of temperature stability, conductivity, and interface matching with the perovskite-type metal oxide electrode. The "main component" refers to the state where Pt occupies 51% by weight or more of the first electrode layer 201. Pt is preferred to be naturally (111)-oriented. In other words, Pt is preferred to be uniaxially (111)-oriented.

When the thickness of the second electrode layer 202 is represented by T2 and the thickness of the first electrode layer 201 is represented by T1, the ratio of the thicknesses of the electrode layers represented by T2/T1 is preferably in the range of $0.1 \leq T2/T1 \leq 1$. The more preferred range is $0.1 \leq T2/T1 \leq 0.4$. When $T2/T1 > 1$ is established, that is, when the second electrode layer 202 is relatively thicker, the resistance value of the lower electrode 2 may be increased, and the response of element driving to an input voltage may become slower. On the other hand, when $T2/T1 < 0.1$ is established, that is, when the second electrode layer 202 is relatively too thin, an excessive stress may occur at the interface with the piezoelectric film 3 and the first electrode layer 201, and the film may peel off in continuous driving. Also focusing on the production of the element, if the uniaxially (111)-oriented piezoelectric film 3 is formed on an excessively thin second electrode layer 202, the degree of crystal orientation thereof may deteriorate.

A method of producing the first electrode layer 201 is not particularly limited. Examples of the method include, similarly to the piezoelectric film 3, an MOCVD method, a CSD method, a PLD method, a sputtering method, a hydrothermal synthesis method, and an AD method. Of those, the sputtering method and the PLD method are production methods suitable for forming a metal electrode at high density.

Further, the upper electrode 4 of the piezoelectric element is formed of a conductive layer having a thickness of about 5 nm to about 2,000 nm. The material therefor is not particularly limited, and any material typically used for a piezoelectric element can be used. Examples of the material include metals such as Ti, Pt, Ta, Ir, Sr, In, Sn, Au, Al, Fe, Cr, Ni, Pd, Ag, and Cu and an oxide thereof. The upper electrode 4 may be formed of one kind thereof, or may be formed of a laminate of two or more kinds thereof. The upper electrode 4 may be the same perovskite-type metal oxide electrode as the second electrode layer 202, or may be a laminate of the metal oxide electrode and a metal electrode.

Both the lower electrode 2 and the upper electrode 4 may each be patterned into a desired shape before being used. The piezoelectric film 3 may be similarly patterned into a desired shape before being used in the element.

The piezoelectric element of the present invention can be used in devices such as a piezoelectric sensor, an ultrasonic vibrator, a piezoelectric actuator, an ink-jet head, a ferroelectric memory, a piezoelectric transformer, and a capacitor.

Figure 2A:
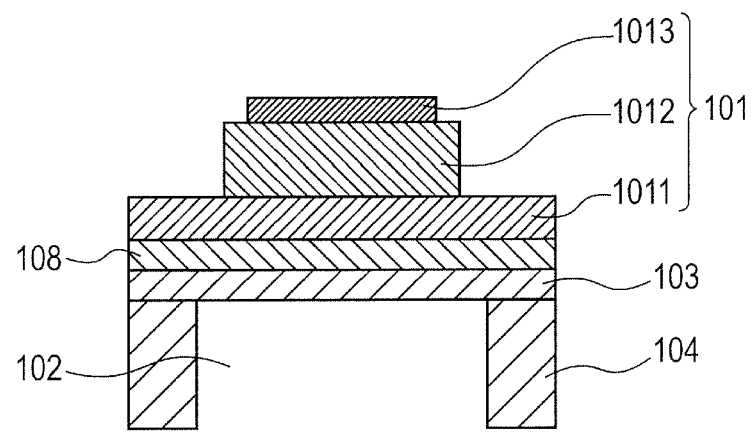
FIG. 2A is a schematic vertical sectional view illustrating the configuration of a liquid discharge head according to an embodiment of the present invention.
Figure 2B:
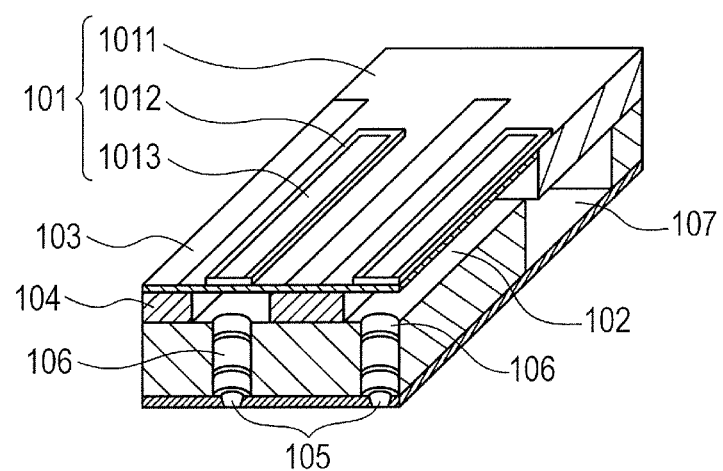
FIG. 2B is a schematic perspective view illustrating the configuration of the liquid discharge head according to the embodiment of the present invention.

FIGS. 2A and 2B are each a schematic view illustrating the configuration of a liquid discharge head according to an embodiment of the present invention. As illustrated in FIGS. 2A and 2B, the liquid discharge head of the present invention is a liquid discharge head having a piezoelectric element 101 of the present invention. The piezoelectric element 101 is a piezoelectric element including at least a lower electrode 1011, a piezoelectric film 1012, and an upper electrode 1013. Although not shown, the lower electrode 1011 includes at least a first electrode layer and a second electrode layer. The piezoelectric film 1012 is patterned as required as illustrated in FIG. 2B.

FIG. 2B is a schematic view of the liquid discharge head. The liquid discharge head includes discharge ports 105, individual liquid chambers 102, communicating holes 106 for connecting the individual liquid chambers 102 and the discharge ports 105, liquid chamber partition walls 104, a common liquid chamber 107, a diaphragm 103, and the piezoelectric elements 101. Each of the piezoelectric elements 101, which is of a rectangular shape in FIG. 2B, may be of a shape except the rectangular shape such as an elliptical shape, a circular shape, or a parallelogram shape. In general, the piezoelectric films 1012 are each of a shape in conformity with the shape of the individual liquid chamber 102.

The vicinity of the piezoelectric element 101 in the liquid discharge head of the present invention is described in detail with reference to FIG. 2A. FIG. 2A is a sectional view of the piezoelectric element in the width direction of the liquid discharge head illustrated in FIG. 2B. The sectional shape of the piezoelectric element 101, which is illustrated in a rectangular shape, may be a trapezoidal shape or a reverse trapezoidal shape. In addition, a buffer layer 108 may be present between the diaphragm 103 and the lower electrode.

It is to be noted that those differences in name are caused by a method of producing the device and an effect of the present invention can be obtained in any case.

In the liquid discharge head, the diaphragm 103 vertically fluctuates owing to the expansion and contraction of the piezoelectric film 1012 to serve as a vibrating member. The vibrating member applies a pressure to a liquid in the individual liquid chamber 102. As a result, the liquid is discharged from the discharge port 105. The liquid discharge head of the present invention can be used in a printer application or the production of an electronic device.

The diaphragm 103 has a thickness of 1.0 µm or more and 15 µm or less, preferably 1.5 µm or more and 8 µm or less. A material for the diaphragm, which is not limited, is preferably an Si-containing material. Si for the diaphragm may be doped with B or P. In addition, the buffer layer and the electrode layer on the diaphragm may serve as part of the diaphragm. The substrate of the piezoelectric element of the present invention may double as the diaphragm.

The buffer layer 108 has a thickness of 5 nm or more and 300 nm or less, preferably 10 nm or more and 200 nm or less.

The size of the discharge port 105 is 5 µm or more and 40 µm or less in terms of a circle-equivalent diameter. The shape of the discharge port 105 may be a circular shape, or may be a star shape, a rectilinear shape, or a triangular shape.

As described above, the piezoelectric element of the present invention is suitably used in the liquid discharge head.

The use of the lead-free piezoelectric element of the present invention can provide a liquid discharge head having a nozzle density and a discharge force comparable to or more than those in the case where a piezoelectric element containing lead is used.

A liquid discharge apparatus according to an embodiment of the present invention will now be described. The liquid discharge apparatus includes the liquid discharge head described above.

Figure 6:
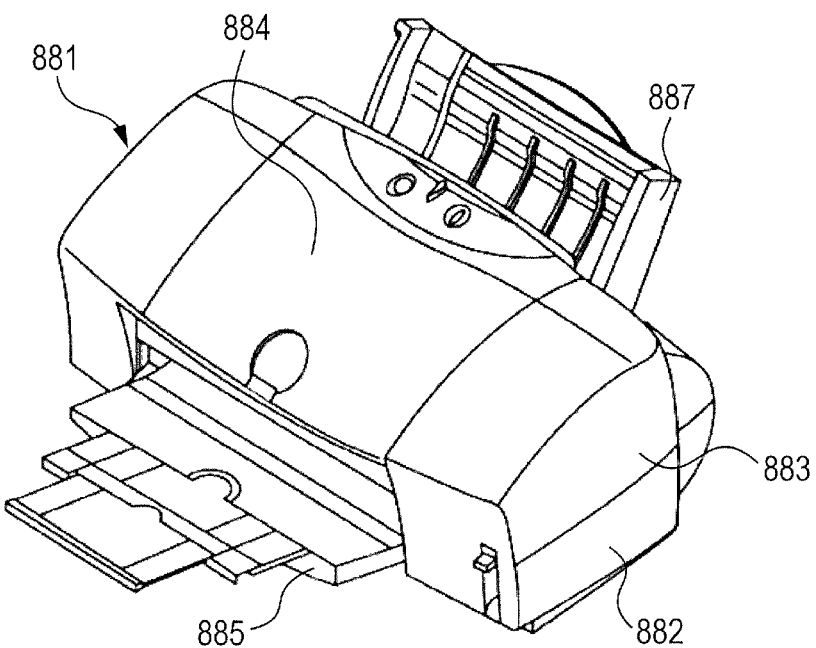
FIG. 6 is a schematic view showing a liquid discharge apparatus according to an embodiment of the invention.
Figure 7:
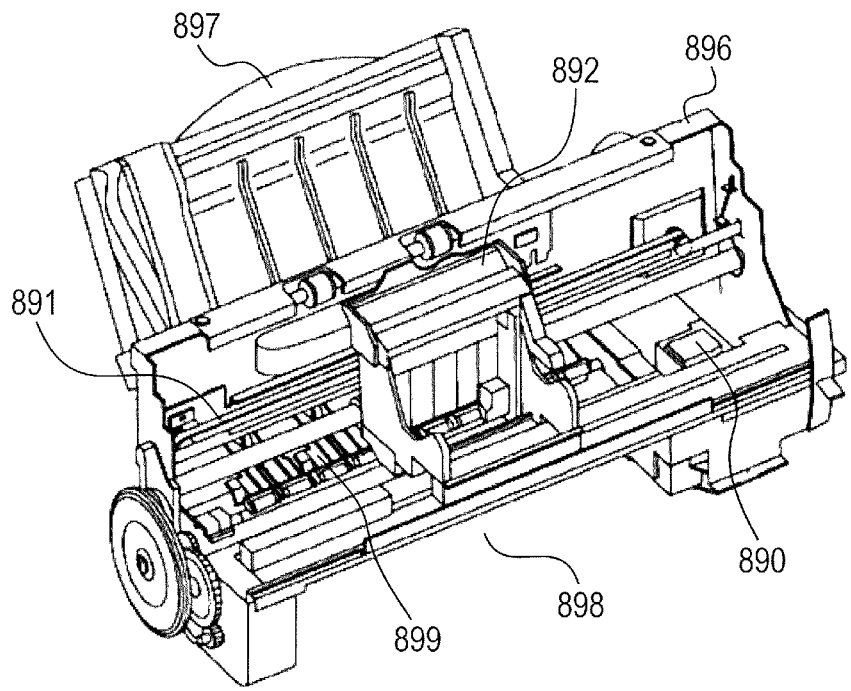
FIG. 7 is another schematic view showing the liquid discharge apparatus.

An example of the liquid discharge apparatus is an ink jet recording apparatus shown in FIGS. 6 and 7. FIG. 7 shows the state in which outer casings 882 to 885 and 887 are removed from a liquid discharge apparatus (ink jet recording apparatus) 881 shown in FIG. 6. The ink jet recording apparatus 881 includes an automatic feeding unit 897 configured to automatically feed a recording paper sheet, i.e., a recording medium, into a main body 896. The ink jet recording apparatus 881 also includes a transport unit 899 that guides the recording sheet fed from the automatic feeding unit 897 to a particular recording position and to a discharge slot 898 from the recording position, a recording unit 891 configured to conduct recording on the recording sheet transferred to the recording position, and a recovery unit 890 configured to conduct a recovery process on the recording unit 891. The recording unit 891 has a carriage 892 that houses the liquid discharge head and moves on a rail in a reciprocating manner.

When an electric signal is input to this ink jet recording apparatus from a computer, the carriage 892 moves on the rail and a driving voltage is applied to the electrodes sandwiching the piezoelectric material so that the piezoelectric material undergoes deformation. This deformation of the piezoelectric material pressurizes the individual liquid reservoir 102 via the vibrating plate 103 and causes ink to be ejected from the discharge port 105, thereby conducting printing.

This liquid discharge apparatus can eject liquid uniformly at a high speed and is small-sized.

Although an example of a printer is described above, the liquid discharge apparatus may be used in industrial liquid discharge apparatuses and drawing apparatuses configured to draw images, characters, etc., on media in addition to printing apparatus such as facsimile machines, multifunction apparatuses, and ink jet recording apparatuses.

A liquid discharge apparatus equipped with a liquid discharge head according to an embodiment of the present invention can exhibit discharge force and discharge accuracy comparable or superior to a liquid discharge apparatus that uses a liquid discharge head including a lead-containing piezoelectric element.

EXAMPLES

Now, the present invention is described more specifically by way of examples. However, the present invention is not limited by the following examples.

Examples 1 to 26

Metal oxide thin films having compositions corresponding to the respective examples of Table 1 were each formed on a substrate by an intermittent metal organic chemical vapor deposition method (MOCVD method).

As the substrate on which the thin films were formed, a commercially available silicon substrate (with a 1 μm-thick $SiO_2$ oxide film) was used. On the surface of the substrate, a titanium oxide ($TiO_x$) layer was formed as an adhesion layer by a sputtering method so as to have a thickness of 10 nm or less. Further, naturally (111)-oriented platinum (Pt) having a thickness of 80 to 200 nm was formed by the sputtering method in the same batch, thereby obtaining a first electrode layer. The substrate heat temperature for the sputtering film formation of $TiO_x$ and Pt was set to 250° C.

On the surface of the first electrode layer, uniaxially (111)-oriented strontium ruthenate ($SrRuO_3$) in pseudo-cubic notation having a thickness of 10 to 40 nm was formed as a second electrode. The $SrRuO_3$ electrode was formed by a sputtering method under the conditions where the substrate heat temperature was 600° C. and the argon/oxygen ratio was 7:3. $SrRuO_3$ ceramics was used as a sputtering target. X-ray diffraction measurement (2θ/θ method) found that the second electrode layer made of $SrRuO_3$ had a uniaxially (111)-oriented perovskite-type structure. The Lotgering factor F indicating the degree of (111) orientation was calculated by removing diffraction peaks resulting from the substrate and the first electrode layer from diffraction peaks for the 2θ angle in the range of 10° to 70°. The calculated Lotgering factor F of each of the second electrode layers was 0.80 or more. X-ray diffraction measurement using an in-plane method confirmed that the second electrode layer was non-oriented in the plane, that is, the second electrode layer was a non-epitaxial orientation film.

There were used, as raw materials for the respective oxides of the metals, dimethyl(2-(N,N-dimethylaminomethyl)phenyl)bismuth ($Bi(CH_3)_2(2-(CH_3)_2NCH_2Ph)$), tri(ethylpentadienyl)iron ($Fe(C_2H_5C_5H_4)_3$), bis(6-ethyl-2,2-dimethyl-3,5-decanedionato)zinc ($Zn(EDMDD)_2$), bis(2,2,6,6-tetramethyl-3,5-heptanedionato)magnesium ($Mg(DPM)_2$), tetra-i-propoxytitanium ($Ti(O.i-Pr)_4$), tris(2,2,6,6-tetramethyl-3,5-heptanedionato)aluminum ($Al(DPM)_3$), tris(2,2,6, 6-tetramethyl-3,5-heptanedionato) (2,2-bipyridyl)lanthanum ($La(TMOD)_3bpy$), tris(2,2,6,6-tetramethyl-3,5-heptanedionato)neodymium ($Nd(DPM)_3$), tris(2,2,6,6-tetramethyl-3,5-heptanedionato) dysprosium ($Dy(DPM)_3$), tris(2,2,6,6-tetramethyl-3,5-heptanedionato)yttrium ($Y(DPM)_3$), and tris(2,2,6,6-tetramethyl-3,5-heptanedionato)manganese ($Mn(DPM)_3$).

Nitrogen was used as a carrier gas, and oxygen and nitrogen were each used as a purge gas. The film formation was intermittently performed by stopping the supply of any such gas for 5 seconds every time the gas was supplied for 10 seconds. A film formation temperature was set to 760° C. The film formation was performed for a total of 200 pulses (50 minutes). Thus, a piezoelectric film having a thickness of 170 nm to 600 nm was obtained.

x, j, k, l, m, and n shown in Table 1 and Table 3 represent the metal composition ratios of the piezoelectric films of the examples, and are normalized so that the relationship of l+m+n=1 may be established. Those values were determined by employing X-ray fluorescence analysis (XRF) and ICP emission spectrometry in combination. The adjustment of film formation conditions for the MOCVD method with ideal values for x, j, and k set to 1.0, 0.5, and 0.5, respectively was able to result in an intended composition ratio. Results obtained for l, m, and n were each correct to three significant figures by virtue of detailed composition analysis.

X-ray diffraction measurement (2θ/θ method) found that each of the piezoelectric films was of a perovskite-type structure uniaxially (111)-oriented. The Lotgering factor F indicating the degree of (111) orientation was calculated by removing diffraction peaks resulting from the substrate and the electrodes from diffraction peaks for the 2θ angle in the range of 10° to 70°. The calculated Lotgering factor F of each of the piezoelectric films was 0.80 or more. X-ray diffraction measurement using an in-plane method confirmed that the piezoelectric film was non-oriented in the plane, that is, the piezoelectric film was a non-epitaxial orientation film. In addition, the crystal systems of the films were each a mixed system having a tetragonal structure and a monoclinic structure, or a single system of a monoclinic structure. In addition, the axial length of the long axis of a unit cell converted from a peak position tended to shorten as the value for m increased.

The surfaces of those piezoelectric films were provided with platinum electrodes each having a diameter of 100 μm by a sputtering method. Thus, piezoelectric elements of the present invention were obtained. The insulation property of each of the piezoelectric elements of Examples 1 to 26 was good. Those piezoelectric elements were used for electrical measurement. Table 1 shows the results together with the compositions.

Ferroelectricity shown in Table 1 shows the result of P-E hysteresis measurement for each of the piezoelectric elements. The P-E hysteresis measurement was performed for judging whether an element of interest showed ferroelectricity at room temperature in a practical electric field. A material showing ferroelectricity in a constant electric field region can be said to have piezoelectricity in the same electric field region, and hence can be used as a memory material. Specifically, the hysteresis of spontaneous polarization when an external electric field having a maximum of ±1,500 kV/cm was applied to the piezoelectric element of the present invention with its phase positively and negatively changed was observed. When a hysteresis curve specific to a ferroelectric material in which spontaneous polarization was inverted was observed, the mark "o" was described in the column "Ferroelectricity" of Table 1. When no ferroelectricity curve was observed in the electric field range, the mark "x" was described in the column. The mark "x" includes the case where the element of interest is ferroelectric but an electric field (coercive electric field) in which the inversion of its polarization occurs outstrips the electric field range.

Insulation property shown in Table 1 shows the result of leak current measurement for each of the piezoelectric elements. The leak current measurement was performed for judging whether an element of interest showed insulation property at room temperature in a practical electric field. Specifically, a leak current value when a DC electric field of 250 kV/cm was applied to the piezoelectric element of the present invention was recorded. When the leak current value was 1 mA/cm or less, i.e., the element showed good insulation property, the mark "o" was described. Otherwise, the mark "x" was described. The leak current value of each of the piezoelectric elements of Examples 1 to 26 was 0.01 mA/cm$^2$ or less. In other words, the elements each showed high insulation property comparable to that of a commercially available thin film of lead zirconate titanate.

A piezoelectric constant shown in Table 1 was determined by a piezoelectric constant ($d_{33}$ constant) measurement method at room temperature with an atomic force microscope (AFM) as a displacement detector. Specifically, the distortion of a piezoelectric element when an applied voltage per thickness of the thin film interposed between electrodes was set to 700 kV/cm was observed with the AFM. The distortion amount was divided by the applied voltage so as to be converted into the piezoelectric constant shown in Table 1. When the distortion amount of an element was so small that the piezoelectric constant was not able to be calculated, the mark "x" was described.

Comparative Examples 1 to 4

Metal oxides having target compositions of Comparative Examples 1 to 4 shown in Table 1 were produced by the MOCVD method in the same manner as in Examples 1 to 26.

The metal oxide of Comparative Example 1 is a solid solution free of the $A(Mg_kTi_{(1-k)})O_3$ component. The metal oxide of Comparative Example 2 is a solid solution containing a smaller amount of the $A(Mg_kTi_{(1-k)})O_3$ component than the piezoelectric element of the present invention does. The metal oxides of Comparative Examples 3 and 4 are each a solid solution free of the $A(Zn_jTi_{(1-j)})O_3$ component.

Each of the metal oxides of Comparative Examples 1 to 4 had a perovskite-type structure uniaxially (111)-oriented. Crystal systems in Comparative Examples 1 and 2 were each a single system of a tetragonal structure, and crystal systems in Comparative Examples 3 and 4 were each a single system of a rhombohedral structure.

Electrical measurement was performed by forming electrodes on the metal oxides of Comparative Examples 1 to 4 in the same manner as in Examples 1 to 26. Table 1 shows the results together with the compositions. Although the elements of Comparative Example 1 and Comparative Example 2 each had high insulation property, their coercive electric fields were so large that none of the elements showed the inversion phenomenon of spontaneous polarization in the range of ±1,500 kV/cm. The elements of Comparative Examples 3 and 4 each had high insulation property too.

In addition, the elements of Comparative Examples 1 and 2 each had a small element distortion amount in piezoelectric measurement, and the $d_{33}$ constant of each of the elements was about 10 pm/V even when approximately converted. Although the elements of Comparative Examples 3 and 4 each showed clear piezoelectricity, their piezoelectric constants ($d_{33}$) shown in Table 1 were not large.

TABLE 1

| | A element | M element | x | j | k | l | m | n | m/(l + m) | Crystal system | Ferro-electricity | Insulation property | Piezoelectric constant d33 (pm/V) |
|---|---|---|---|---|---|---|---|---|---|---|---|---|---|
| Example 1 | Bi | Fe | 1.0 | 0.5 | 0.5 | 0.450 | 0.191 | 0.359 | 0.298 | Tetragonal + monoclinic | o | o | 140 |
| Example 2 | Bi | Fe | 1.0 | 0.5 | 0.5 | 0.482 | 0.212 | 0.306 | 0.305 | Tetragonal + monoclinic | o | o | 155 |
| Example 3 | Bi | Fe | 1.0 | 0.5 | 0.5 | 0.363 | 0.190 | 0.447 | 0.344 | Tetragonal + monoclinic | o | o | 170 |
| Example 4 | Bi 70% La 30% | Fe 95% Mn 5% | 0.9 | 0.6 | 0.4 | 0.466 | 0.260 | 0.274 | 0.358 | Tetragonal + monoclinic | o | o | 115 |
| Example 5 | Bi | Fe | 1.0 | 0.5 | 0.5 | 0.356 | 0.248 | 0.396 | 0.411 | Tetragonal + monoclinic | o | o | 175 |
| Example 6 | Bi 97% Dy 3% | Fe 99% Y 0.5% Mn 0.5% | 1.1 | 0.4 | 0.6 | 0.475 | 0.335 | 0.190 | 0.414 | Tetragonal + monoclinic | o | o | 130 |
| Example 7 | Bi 99.9% La 0.1% | Al 99.9% Mn 0.1% | 1.0 | 0.4 | 0.5 | 0.393 | 0.295 | 0.312 | 0.429 | Tetragonal + monoclinic | o | o | 180 |
| Example 8 | Bi | Fe | 1.0 | 0.5 | 0.5 | 0.338 | 0.302 | 0.360 | 0.472 | Tetragonal + monoclinic | o | o | 190 |
| Example 9 | Bi | Fe | 1.0 | 0.5 | 0.5 | 0.323 | 0.297 | 0.380 | 0.479 | Tetragonal + monoclinic | o | o | 190 |
| Example 10 | Bi | Fe | 1.0 | 0.5 | 0.5 | 0.335 | 0.357 | 0.308 | 0.516 | Tetragonal + monoclinic | o | o | 210 |
| Example 11 | Bi | Fe | 1.0 | 0.5 | 0.5 | 0.374 | 0.440 | 0.186 | 0.541 | Tetragonal + monoclinic | o | o | 225 |
| Example 12 | Bi | Fe | 1.0 | 0.5 | 0.5 | 0.256 | 0.326 | 0.418 | 0.560 | Tetragonal + monoclinic | o | o | 230 |
| Example 13 | Bi 70% La 30% | Al | 1.0 | 0.5 | 0.4 | 0.282 | 0.360 | 0.358 | 0.561 | Tetragonal + monoclinic | o | o | 190 |
| Example 14 | Bi | Fe | 1.0 | 0.5 | 0.5 | 0.266 | 0.363 | 0.371 | 0.577 | Tetragonal + monoclinic | o | o | 270 |
| Example 15 | Bi | Fe | 1.0 | 0.5 | 0.5 | 0.349 | 0.520 | 0.131 | 0.598 | Monoclinic | o | o | 255 |
| Example 16 | Bi | Fe | 1.0 | 0.5 | 0.5 | 0.252 | 0.378 | 0.370 | 0.600 | Tetragonal + monoclinic | o | o | 275 |
| Example 17 | Bi | Fe | 1.0 | 0.5 | 0.5 | 0.247 | 0.393 | 0.360 | 0.614 | Monoclinic | o | o | 305 |
| Example 18 | Bi | Fe | 1.0 | 0.5 | 0.5 | 0.244 | 0.400 | 0.356 | 0.621 | Monoclinic | o | o | 320 |
| Example 19 | Bi | Fe | 1.0 | 0.5 | 0.5 | 0.271 | 0.453 | 0.276 | 0.626 | Monoclinic | o | o | 320 |
| Example 20 | Bi | Fe | 1.0 | 0.5 | 0.5 | 0.216 | 0.447 | 0.337 | 0.674 | Monoclinic | o | o | 330 |
| Example 21 | Bi | Fe | 1.0 | 0.5 | 0.5 | 0.201 | 0.446 | 0.353 | 0.689 | Monoclinic | o | o | 335 |
| Example 22 | Bi | Fe | 1.0 | 0.5 | 0.5 | 0.169 | 0.447 | 0.384 | 0.726 | Monoclinic | o | o | 310 |
| Example 23 | Bi | Fe | 1.0 | 0.5 | 0.5 | 0.164 | 0.476 | 0.360 | 0.744 | Monoclinic | o | o | 295 |
| Example 24 | Bi | Fe | 1.0 | 0.5 | 0.5 | 0.160 | 0.489 | 0.351 | 0.753 | Monoclinic | o | o | 280 |
| Example 25 | Bi 99.5% Nd 0.5% | Fe | 1.0 | 0.5 | 0.5 | 0.138 | 0.540 | 0.322 | 0.796 | Monoclinic | o | o | 260 |

TABLE 1-continued

| | A element | M element | x | j | k | l | m | n | m/(l + m) | Crystal system | Ferro-electricity | Insulation property | Piezoelectric constant d33 (pm/V) |
|---|---|---|---|---|---|---|---|---|---|---|---|---|---|
| Example 26 | Bi | Fe | 1.0 | 0.5 | 0.5 | 0.094 | 0.635 | 0.271 | 0.871 | Monoclinic | ○ | ○ | 250 |
| Comparative Example 1 | Bi | Fe | 1.0 | 0.5 | — | 0.666 | 0.000 | 0.334 | 0.000 | Tetragonal | x | ○ | x |
| Comparative Example 2 | Bi | Fe | 1.0 | 0.5 | 0.5 | 0.534 | 0.107 | 0.359 | 0.167 | Tetragonal | x | ○ | x |
| Comparative Example 3 | Bi | Fe | 1.0 | — | 0.5 | 0.000 | 0.612 | 0.388 | 1.000 | Rhombohedra | ○ | ○ | 50 |
| Comparative Example 4 | Bi | Fe | 1.0 | — | 0.5 | 0.000 | 0.642 | 0.358 | 1.000 | Rhombohedra | ○ | ○ | 60 |

Examples 27 to 37

Piezoelectric films having compositions corresponding to the respective examples of Table 2 were each formed on a substrate by a pulse laser deposition method (PLD method).

As the substrate on which the thin films of Examples 27 to 37 were formed, a silicon substrate with a lower electrode similarly to Examples 1 to 26 was used. In other words, a silicon substrate with an oxide film was used, which had uniaxially (111)-oriented strontium ruthenate ($SrRuO_3$) in pseudo-cubic notation having a thickness of 10 to 40 nm as the second electrode and naturally (111)-oriented platinum (Pt) having a thickness of 80 to 200 nm as the first electrode layer.

Used as a target material on which pulse laser was incident was a pellet obtained by: mixing $Bi_2O_3$, $La_2O_3$, $Sm_2O_3$, ZnO, MgO, $TiO_2$, and $Fe_2O_3$; pulverizing the mixture; pre-baking the pulverized product in an electric furnace at 750° C. for 5 hours; further adding 10 wt % of PVB to the pre-baked powder; molding the mixture; and post-baking the molded product in an electric furnace at 790° C. for 6 hours. It is to be noted that the contents of $Bi_2O_3$ and ZnO were each made excessive by 5 to 20 at. % with respect to the target composition of the piezoelectric film in consideration of a fluctuation in composition at the time of film formation.

Film formation conditions for the PLD method are as described below.
Laser: KrF excimer laser, 210 mJ
Pulse interval: 2 Hz
Distance between the target and the substrate: 40 mm
Film formation pressure: An oxygen atmosphere at 500 mTorr and a flow rate of 3 sccm
Substrate temperature: 630° C.

Film formation was performed for a total of 4,800 pulses (40 minutes). Thus, a piezoelectric film having a thickness of 150 nm to 520 nm was obtained.

x, j, k, l, m, and n shown in Table 2 were calculated in the same manner as in Examples 1 to 26.

X-ray diffraction measurement found that each of the piezoelectric films of Examples 27 to 37 was of a perovskite-type structure uniaxially (111)-oriented. In addition, the crystal systems of the films were each a mixed system having a tetragonal structure and a monoclinic structure, a single system of a monoclinic structure, or a mixed system having a monoclinic structure and a rhombohedral structure.

The surfaces of those piezoelectric films were provided with platinum electrodes each having a diameter of 100 μm by a sputtering method. Thus, piezoelectric elements of the present invention were obtained. The results of the measurement of the electrical properties and piezoelectric properties of the piezoelectric elements are as shown in Table 2.

Comparative Example 5

A metal oxide having a target composition of Comparative Example 5 shown in Table 2 was produced by the PLD method in the same manner as in Examples 27 to 37.

The metal oxide of Comparative Example 5 is a solid solution free of the $A(Mg_kTi_{(1-k)})O_3$ component.

According to X-ray diffraction measurement, the main phase of the metal oxide of Comparative Example 5 was a bismuth layer structure, and no metal oxide having a perovskite structure was not able to be obtained.

Electrical measurement was performed by forming electrodes on the metal oxide of Comparative Example 5 in the same manner as in Examples 27 to 37. Table 2 shows the results together with the composition. The element of Comparative Example 5 was poor in insulation property, and showed neither ferroelectricity nor piezoelectricity.

TABLE 2

| | A element | M element | x | j | k | l | m | n | m/(l + m) | Crystal system | Ferro-electricity | Insulation property | Piezoelectric constant d33 (pm/V) |
|---|---|---|---|---|---|---|---|---|---|---|---|---|---|
| Example 27 | Bi | Fe | 1.0 | 0.5 | 0.5 | 0.260 | 0.200 | 0.540 | 0.435 | Tetragonal + monoclinic | ○ | ○ | 180 |
| Example 28 | Bi | Fe | 1.0 | 0.5 | 0.4 | 0.282 | 0.261 | 0.457 | 0.481 | Tetragonal + monoclinic | ○ | ○ | 215 |
| Example 29 | Bi | Fe | 1.1 | 0.5 | 0.5 | 0.220 | 0.240 | 0.540 | 0.522 | Tetragonal + monoclinic | ○ | ○ | 215 |
| Example 30 | Bi 90% La 10% | Fe | 1.0 | 0.6 | 0.5 | 0.215 | 0.352 | 0.433 | 0.621 | Tetragonal + monoclinic | ○ | ○ | 220 |
| Example 31 | Bi 95% La 5% | Fe | 1.1 | 0.5 | 0.5 | 0.224 | 0.369 | 0.407 | 0.622 | Tetragonal + monoclinic | ○ | ○ | 255 |
| Example 32 | Bi | Fe | 1.1 | 0.5 | 0.5 | 0.194 | 0.330 | 0.476 | 0.630 | Tetragonal + monoclinic | ○ | ○ | 270 |
| Example 33 | Bi 99.9% La 0.1% | Fe | 1.0 | 0.5 | 0.5 | 0.218 | 0.406 | 0.376 | 0.651 | Tetragonal + monoclinic | ○ | ○ | 290 |
| Example 34 | Bi 99.9% La 0.1% | Fe | 1.1 | 0.5 | 0.5 | 0.223 | 0.422 | 0.355 | 0.654 | Monoclinic | ○ | ○ | 300 |

TABLE 2-continued

| | A element | M element | x | j | k | l | m | n | m/(l + m) | Crystal system | Ferro-electricity | Insulation property | Piezoelectric constant d33 (pm/V) |
|---|---|---|---|---|---|---|---|---|---|---|---|---|---|
| Example 35 | Bi 95% Sm 5% | Fe | 1.0 | 0.4 | 0.5 | 0.171 | 0.413 | 0.416 | 0.707 | Monoclinic | ○ | ○ | 320 |
| Example 36 | Bi | Fe | 1.0 | 0.5 | 0.6 | 0.105 | 0.385 | 0.510 | 0.786 | Monoclinic | ○ | ○ | 285 |
| Example 37 | Bi | Fe | 0.9 | 0.5 | 0.5 | 0.094 | 0.468 | 0.438 | 0.833 | Monoclinic + rhombohedral | ○ | ○ | 260 |
| Comparative Example 5 | Bi | Fe | 1.1 | 0.4 | — | 0.467 | 0.000 | 0.533 | 0.000 | Non-perovskite | x | x | x |

Examples 38 to 42

Piezoelectric films having compositions corresponding to the respective examples of Table 3 were each formed on a substrate by a chemical solution deposition method (CSD method).

As the substrate on which the thin films of Examples 38 to 42 were formed, a silicon substrate with a lower electrode similarly to Examples 1 to 26 was used. In other words, a silicon substrate with an oxide film was used, which had uniaxially (111)-oriented strontium ruthenate ($SrRuO_3$) in pseudo-cubic notation having a thickness of 10 to 40 nm as the second electrode and naturally (111)-oriented platinum (Pt) having a thickness of 80 to 200 nm as the first electrode layer.

Precursor solutions for metal oxides to be used in CSD film formation were prepared according to the following procedure.

Used as raw materials for the precursor solutions were tri-t-amyloxybismuth ($Bi(O.t-Am)_3$), zinc acetate dihydrate ($Zn(OAc)_2 \cdot 2H_2O$), diethoxymagnesium ($Mg(OEt)_2$), tetra-n-butoxytitanium ($Ti(O.n-Bu)_4$), iron acetylacetonate ($Fe(acac)_3$), tri-sec-butyoxyaluminum ($Al(O.sec-Bu)_3$), tri-i-propoxylanthanum ($La(O.i-Pr)_3$), tri-i-propoxyscandium ($Sc(O.i-Pr)_3$), and tri-i-propoxypraseodymium ($Pr(O.i-Pr)_3$).

The raw materials were each added at the same molar ratio as the target composition shown in Table 3 in terms of a metal to 2-methoxyethanol as a solvent, and were then dissolved under stirring. Added to a system using zinc acetate dihydrate was an equal mole of monoethanolamine for aiding the solubility of a zinc component.

A moderate amount of 2-methoxyethanol was added to each solution so that the resultant solution had a concentration of 0.1 mol/L. Thus, application solutions used in Examples 38 to 42 were obtained.

The precursor solutions corresponding to the respective examples of Table 3 were each applied onto the substrate with a spin coater (3,000 rpm). The applied layer was dried under heating with a hot plate at 150° C. for 1 minute so that the solvent was removed. After that, the resultant product was baked in a rapid thermal infrared annealing furnace (hereinafter referred to as "RTA") at 500° C. for 1 minute. Thus, a first layer was formed. Next, layers like a second layer and a third layer were repeatedly laminated on the first layer in the same manner as in the first layer. Thus, a total of 27 laminated films were obtained. Finally, the laminated films were baked under a nitrogen atmosphere in the RTA at 700° C. for 3 minutes so as to be crystallized. Thus, a piezoelectric film having a thickness of 350 nm to 600 nm was obtained.

x, j, k, l, m, and n shown in Table 3 were calculated in the same manner as in Examples 1 to 37 where the piezoelectric materials were each of a film-like shape.

X-ray diffraction measurement found that each of the piezoelectric films of Examples 38 to 42 was of a perovskite-type structure uniaxially (111)-oriented. In addition, the crystal systems of the films were each a mixed system having a tetragonal structure and a monoclinic structure, a single system of a monoclinic structure, or a mixed system having a monoclinic structure and a rhombohedral structure.

The surfaces of those piezoelectric films were provided with platinum electrodes each having a diameter of 100 μm by a sputtering method. Thus, piezoelectric elements of the present invention were obtained. The results of the measurement of the electrical properties and piezoelectric properties of the piezoelectric elements are as shown in Table 3.

Comparative Examples 6 and 7

Metal oxides having target compositions of Comparative Examples 6 and 7 shown in Table 3 were produced by the CSD method in the same manner as in Examples 38 to 42. The metal oxides of Comparative Examples 6 and 7 are each a solid solution free of the $A(Zn_jTi_{(1-j)})O_3$ component.

The metal oxides of Comparative Examples 6 and 7 each had a perovskite-type structure uniaxially (111)-oriented, and their crystal systems were each a single system of a rhombohedral structure.

Electrical measurement was performed by forming electrodes on the metal oxides of Comparative Examples 6 and 7 in the same manner as in Examples 38 to 42. Table 3 shows the results together with the compositions. The elements of Comparative Example 6 and Comparative Example 7 each had high insulation property and ferroelectricity. In addition, the elements of Comparative Examples 6 and 7 each showed clear piezoelectricity, but their piezoelectric constants ($d_{33}$) shown in Table 3 were not large.

TABLE 3

| | A element | M element | x | j | k | l | m | n | m/(l + m) | Crystal system | Ferro-electricity | Insulation property | Piezoelectric constant d33 (pm/V) |
|---|---|---|---|---|---|---|---|---|---|---|---|---|---|
| Example 38 | Bi | Fe | 1.0 | 0.5 | 0.5 | 0.350 | 0.380 | 0.270 | 0.521 | Tetragonal + monoclinic | ○ | ○ | 230 |
| Example 39 | Bi 99% Pr 1% | Fe 99.5% Sc 0.5% | 1.0 | 0.5 | 0.5 | 0.255 | 0.495 | 0.250 | 0.660 | Tetragonal + monoclinic | ○ | ○ | 270 |

TABLE 3-continued

| | A element | M element | x | j | k | l | m | n | m/(l + m) | Crystal system | Ferro-electricity | Insulation property | Piezo-electric constant d33 (pm/V) |
|---|---|---|---|---|---|---|---|---|---|---|---|---|---|
| Example 40 | Bi 95% La 5% | Fe 90% Al 10% | 1.1 | 0.5 | 0.5 | 0.230 | 0.640 | 0.130 | 0.736 | Monoclinic | o | o | 275 |
| Example 41 | Bi | Fe | 1.0 | 0.5 | 0.5 | 0.170 | 0.560 | 0.270 | 0.767 | Monoclinic | o | o | 330 |
| Example 42 | Bi | Fe | 1.0 | 0.5 | 0.5 | 0.165 | 0.610 | 0.225 | 0.787 | Monoclinic | o | o | 280 |
| Comparative Example 6 | Bi | Fe | 1.0 | — | 0.5 | 0.000 | 0.780 | 0.220 | 1.000 | Rhombohedral | o | o | 50 |
| Comparative Example 7 | Bi | Fe | 1.0 | — | 0.5 | 0.000 | 0.730 | 0.270 | 1.000 | Rhombohedral | o | o | 40 |

Figure 4:
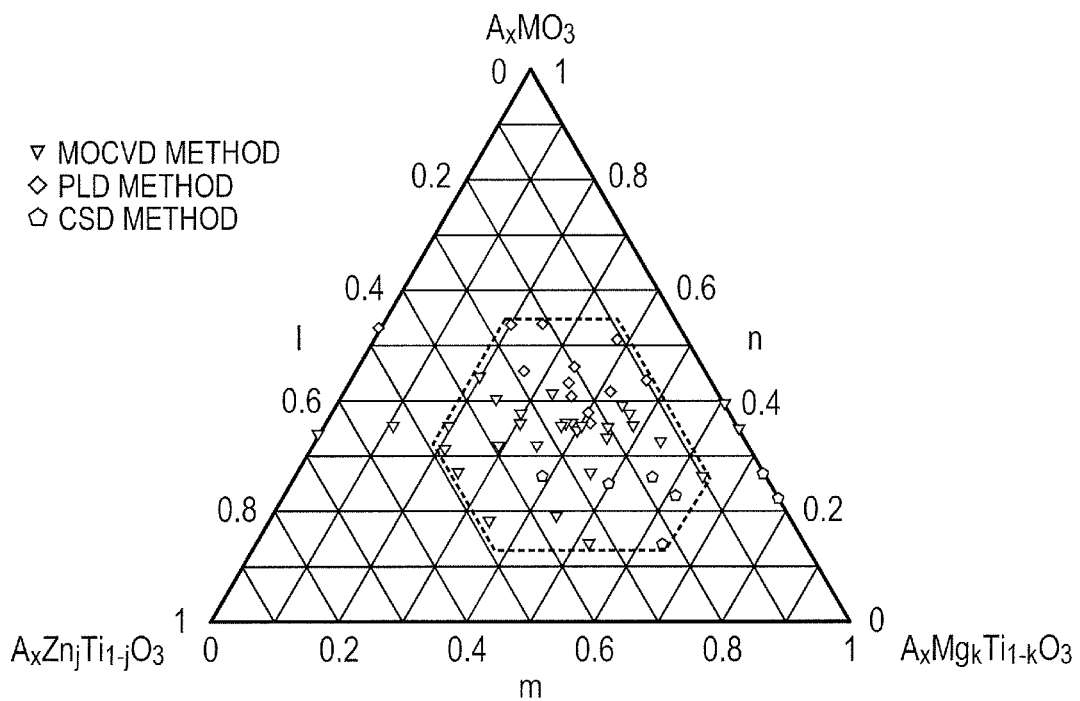
FIG. 4 is a ternary phase diagram illustrating the relationship of a production method and the composition of metal oxides according to Examples 1 to 42 and Comparative Examples 1 to 7 of the present invention.
Figure 5:
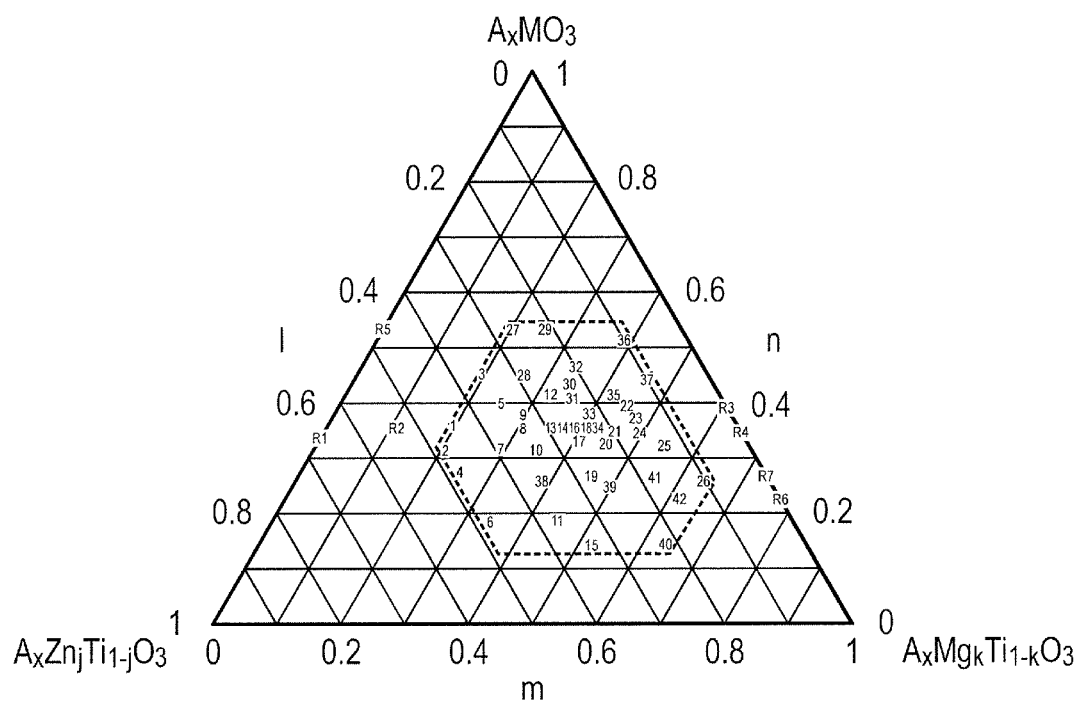
FIG. 5 is a ternary phase diagram illustrating the relationship of the composition of the metal oxides according to Examples 1 to 42 and Comparative Examples 1 to 7 of the present invention.

FIG. 4 is a ternary phase diagram illustrating the relationship of a production method and the composition of perovskite-type metal oxides constituting the piezoelectric elements according to Examples 1 to 42 and Comparative Examples 1 to 7 of the present invention. Further, FIG. 5 is a ternary phase diagram illustrating the relationship of the composition of the perovskite-type metal oxides constituting the piezoelectric elements according to Examples 1 to 42 and Comparative Examples 1 to 7 of the present invention and the example number. In the phase diagram, the numerical value represents the number of Examples, and the numerical value prefixed with R represents the number of Comparative Examples.

FIG. 4, FIG. 5, Table 1, Table 2, and Table 3 suggested that each piezoelectric element of the present invention had high piezoelectricity and was superior in piezoelectricity to the metal oxide of each of the comparative examples.

In Examples 14 to 21, Examples 32 to 35, and Examples 41 and 42, the ratio between the thickness T2 of the second electrode layer and the thickness T1 of the first electrode layer was $0.1 \leq T2/T1 \leq 0.4$, and the piezoelectric element of each of the examples had high piezoelectricity.

In addition, although the piezoelectric elements of the present invention were produced by the MOCVD method, the pulse laser deposition method, and the chemical solution deposition method in Examples 1 to 42 described above, similar piezoelectric elements can be obtained by other methods of producing metal oxide thin films.

(Production of Liquid Discharge Head)

The same piezoelectric elements as those in Examples 1 to 42 were used to produce liquid discharge heads illustrated in FIGS. 2A and 2B. In the liquid discharge heads, the discharge of ink following an input electric signal was confirmed. Further, even after the discharge of ink for $10^8$ times or more, the peeling or degradation of the electrodes and the piezoelectric film was not confirmed. In particular, the liquid discharge heads formed of the piezoelectric elements according to Examples 14 to 21, Examples 32 to 35, and Examples 41 and 42 had no change between the initial discharge amount and the discharge amount after the discharge for $10^8$ times.

(Production of Liquid Discharge Apparatus)

A liquid discharge apparatus shown in FIG. 6 was fabricated by using a liquid discharge head shown in FIG. 2 including a piezoelectric element of Example 1 to 42. Discharge of ink onto a recording medium in response to input electrical signals was confirmed.

According to the present invention, it is possible to provide the piezoelectric element free of any component harmful to an environment and having large piezoelectric strain, the liquid discharge head and the liquid discharge apparatus. Further, the piezoelectric element of the present invention is excellent in interlayer adhesion, and is therefore advantageous also in terms of continuous driving durability when used in the liquid discharge head.

The piezoelectric element of the present invention is applicable to an MEMS technology as well, and can find use in instruments using large amounts of ferroelectric elements and piezoelectric elements such as a ferroelectric memory, a ferroelectric sensor, and a piezoelectric vibrator without any problem.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-041571, filed Feb. 28, 2012, which is hereby incorporated by reference herein in its entirety.

What is claimed is:

1. A piezoelectric element, comprising, on a substrate:
   a piezoelectric film; and
   a pair of electrodes provided in contact with the piezoelectric film;
   wherein the piezoelectric film comprises a perovskite-type metal oxide represented by the following general formula (1) as a main component:

$$A_x(Zn_jTi_{(1-j)})_l(Mg_kTi_{(1-k)})_mM_nO_3 \qquad \text{General Formula (1)}$$

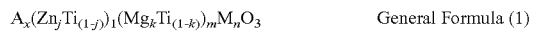

where A represents one of a Bi element, and one or more kinds of elements selected from trivalent metal elements and containing at least a Bi element; M represents at least one kind of element selected from Fe, Al, Sc, Mn, Y, Ga, and Yb; and $0.9 \leq x \leq 1.25$, $0.4 \leq j \leq 0.6$, $0.4 \leq k \leq 0.6$, $0.09 \leq l \leq 0.49$, $0.19 \leq m \leq 0.64$, $0.13 \leq n \leq 0.55$, and $l+m+n=1$ are satisfied,
   wherein the perovskite-type metal oxide is uniaxially (111)-oriented in pseudo-cubic notation in a thickness direction,
   wherein, of the pair of electrodes, a lower electrode provided on the substrate side comprises a multilayer electrode including at least a first electrode layer in contact with the substrate and a second electrode layer in contact with the piezoelectric film, and
   wherein the second electrode layer comprises a perovskite-type metal oxide electrode which is uniaxially (111)-oriented in pseudo-cubic notation in a thickness direction.

2. The piezoelectric element according to claim 1, wherein the second electrode layer is formed of a perovskite-type metal oxide represented by $M1RuO_3$, where M1 represents at least one kind selected from the group consisting of Sr, Ba, and Ca.

3. The piezoelectric element according to claim 1, wherein the A is formed only of the Bi element.

4. The piezoelectric element according to claim 1, wherein the A contains at least one kind of element selected from the group consisting of trivalent lanthanoids in addition to the Bi element.

5. The piezoelectric element according to claim 4, wherein the at least one kind of element in the A comprises an La element.

6. The piezoelectric element according to claim 4, wherein a ratio of the Bi element to the A is 70 mol % or more and 99.9 mol % or less.

7. The piezoelectric element according to claim 1, wherein the M is formed of at least one, or both, of Fe and Al elements.

8. The piezoelectric element according to claim 7, wherein the M contains 0.1 mol % or more and 5 mol % or less of an Mn element.

9. The piezoelectric element according to claim 1, wherein a crystal system of the perovskite-type metal oxide includes at least a monoclinic structure.

10. The piezoelectric element according to claim 1, wherein a crystal system of the perovskite-type metal oxide is formed only of a monoclinic structure.

11. The piezoelectric element according to claim 1, wherein the piezoelectric film has a thickness of 150 nm or more and 10 μm or less.

12. The piezoelectric element according to claim 1, wherein the first electrode layer comprises a metal electrode.

13. The piezoelectric element according to claim 12, wherein a crystal structure of the metal electrode is a face-centered cubic lattice structure at 25° C.

14. The piezoelectric element according to claim 13, wherein the first electrode layer contains, as a main component, platinum which is (111)-oriented in a thickness direction.

15. The piezoelectric element according to claim 1, wherein a ratio between a thickness T2 of the second electrode layer and a thickness T1 of the first electrode layer is $0.1 \leq T2/T1 \leq 1$.

16. A liquid discharge head, comprising at least:
a liquid chamber including a vibrating unit provided with the piezoelectric element according to claim 1; and
a discharge port which communicates with the liquid chamber.

17. A liquid discharge apparatus comprising:
a transport unit configured to transport a recording medium; and
the liquid discharge head according to claim 16.

* * * * *